United States Patent
Lai et al.

(10) Patent No.: US 6,444,105 B1
(45) Date of Patent: *Sep. 3, 2002

(54) PHYSICAL VAPOR DEPOSITION REACTOR INCLUDING MAGNET TO CONTROL FLOW OF IONS

(75) Inventors: Kwok F. Lai, Palo Alto; Andrew L. Nordquist; Kaihan A. Ashtiani, both of Mountain View; Larry D. Hartsough, Berkeley; Karl B. Levy, Los Altos, all of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/687,253

(22) Filed: Oct. 12, 2000

Related U.S. Application Data

(63) Continuation of application No. 09/345,466, filed on Jun. 30, 1999.
(60) Provisional application No. 60/114,812, filed on Jan. 5, 1999.

(51) Int. Cl.[7] ........................... C23C 14/32; C23C 14/33
(52) U.S. Cl. ..................... 204/298.21; 204/298.22; 204/298.16; 204/298.17; 204/298.19; 204/298.2; 204/298.12; 204/298.18
(58) Field of Search ................ 204/298.16, 298.17, 204/298.18, 298.19, 298.2, 298.21, 298.22, 298.12

(56) References Cited

U.S. PATENT DOCUMENTS

| | | | | |
|---|---|---|---|---|
| 4,622,121 A | * | 11/1986 | Wegmann et al. | 204/298.19 |
| 5,482,611 A | * | 1/1996 | Helmer et al. | 204/298.17 |
| 5,688,382 A | * | 11/1997 | Besen et al. | 204/298.16 |
| 6,179,973 B1 | * | 1/2001 | Lai et al. | 204/192.12 |

* cited by examiner

*Primary Examiner*—Mark F. Huff
*Assistant Examiner*—Daborah Chacko-Davis
(74) *Attorney, Agent, or Firm*—Skjerven Morrill LLP; Philip W. Woo

(57) ABSTRACT

A novel hollow cathode magnetron source is disclosed. The source comprises a hollow cathode with a non-planar target. By using a magnet between the cathode and a substrate, plasma can be controlled to achieve high ionization levels, good step coverage, and good process uniformity.

23 Claims, 10 Drawing Sheets

PHYSICAL VAPOR DEPOSITION REACTOR INCLUDING MAGNET TO CONTROL FLOW OF IONS

CROSS REFERENCE TO RELATED APPLICATION

This application claims priority from U.S. Provisional Application No. 60/114,812 filed on Jan. 5, 1999. This application is a continuation of application No. 09/345,466, filed Jun. 30, 1999, entitled "Apparatus And Method For Controlling Plasma Uniformity Across A Substrate".

BACKGROUND OF THE INVENTION

1. Field of the Invention

The present invention generally relates to sputtering apparatus and methods used in semiconductor device fabrication.

2. Description of the Related Art

In a physical vapor deposition ("PVD") process, atoms sputtered from a target are deposited onto a semiconductor substrate. The target, which could be made of aluminum, for example, is located a distance away from the substrate. A plasma of a gas suitable for sputtering, such as argon, is maintained between the target and the substrate. Ions of the sputtering gas are accelerated onto the target by applying a negative potential thereon. When accelerated ions hit the target, atoms are sputtered from the target and onto the substrate.

In a conventional PVD process, magnetic fields are employed to cause the electrons to spiral through the plasma, thereby increasing the electrons' residence time and ionization efficiency. This leads to higher ionization levels which, in turn, increases the deposition rate because there are more ions available to sputter atoms off the target and onto the substrate. The use of magnetic fields in a PVD process is also known as magnetron sputtering. In conventional magnetron sputtering, the ionization levels are not high enough throughout the chamber to yield substantially more ionized sputtered metal atoms than neutral metal atoms. Because neutral atoms are not affected by electric or magnetic fields, their trajectory towards the substrate cannot be influenced by using magnets or electric potential.

The control of the direction or flow of sputtered atoms onto the substrate is very important in any PVD process. For example, in applications requiring the deposition of a thin layer of barrier or liner metal in a trench or via, deposition of sufficient material on the bottom and sidewalls (step coverage) depends on the capability of the PVD process to direct the flow of sputtered atoms onto the substrate. In gap-fill applications, or filling of vias and trenches with primary metals, obtaining good step coverage similarly requires directionality of sputtered atoms. Conventional magnetron sputtering has proven to be inadequate in the aforementioned applications because it does not yield high levels of ionized atoms whose trajectories can be influenced by using magnetic or electric fields. This problem is exacerbated in the manufacture of advanced semiconductor devices where narrow and high-aspect ratio structures are used.

It is also important to obtain good step coverage uniformity across the substrate. Step coverage uniformity depends on precise control of the flow of sputtered atoms to the substrate.

From the foregoing, it is highly desirable to be able to control the direction of sputtered atoms in a PVD process in order to achieve excellent step coverage with good deposition uniformity across the substrate.

SUMMARY OF THE INVENTION

The present invention provides for a novel hollow cathode magnetron source ("HCM"). By utilizing a magnet located between the cathode and a semiconductor substrate, the magnetic fields generated by the HCM can be shaped to increase the amount of plasma confined within the cathode, thereby increasing the ionization levels of sputtered atoms. Further, by controlling the field strength of the magnet between the cathode and the substrate, the direction or flow of the plasma escaping from the cathode can be adjusted to achieve a desired deposition uniformity.

BRIEF DESCRIPTION OF THE DRAWINGS

The use of the same reference symbols in different drawings indicates similar or identical items.

DESCRIPTION OF THE PREFERRED EMBODIMENTS(S)

The present invention provides for a novel hollow cathode magnetron source ("HCM"). The film step coverage and uniformity are enhanced by using a novel magnetic configuration to increase ionization levels and to directionally control the flow of plasma out of the cathode. In one embodiment of the invention, the HCM is shielded to reduce magnetic leakage.

U.S. Pat. No. 5,482,611 to Helmer et. al. ("Helmer"), incorporated herein by reference in its entirety, also discloses an HCM. Helmer teaches that by providing a magnetic field having a magnetic null region at the opening of the hollow cathode, ions and electrons can be trapped and retained inside the hollow cathode except for those which have entered into the upper edge of the null region with sufficient axial velocity and very little radial velocity. Ions and electrons that have primarily axial velocity are able to leave the hollow cathode along the axis at the upper edge of the null region. Most other plasma particles, however, are reflected back and confined in the hollow cathode thereby increasing the plasma density. In essence, the shape of the magnetic field providing the magnetic null functions like a mirror ("mirror effect") which reflects most of the electrons back into the hollow cathode in order to sustain a high density plasma. To maintain charge balance, positive ions will be confined in the cathode along with the electrons by ambipolar diffusion. An HCM which provides a null-field region, such as the one described in Helmer, for example, is also referred to as a null-field magnetron source.

Figure 1:
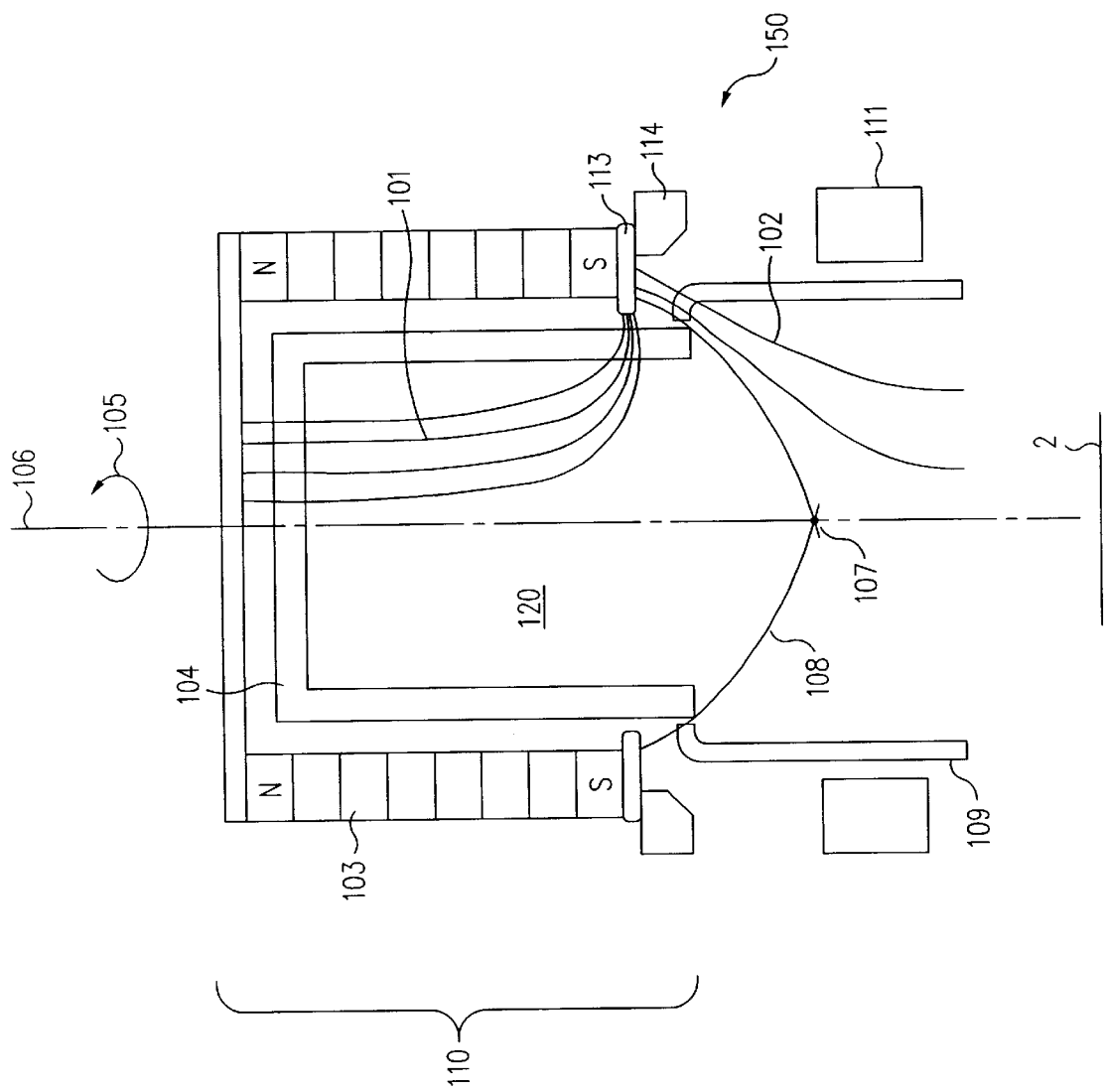
FIG. 1 shows a hollow cathode magnetron source according to the present invention.

FIG. 1 shows an HCM 150 according to the present invention. As indicated by an arrow 105, HCM 150 is symmetrical about an axis 106. HCM 150 has a cathode 110 and an electrically floating anode 109. Cathode 110 also includes a non-planar target 104 which provides the material to be deposited onto a wafer substrate 2. By way of example, target 104 can be made of aluminum, tantalum, titanium, or copper. Cathode 110 and target 104 can be of any hollow non-planar shape.

Plasma is generated in HCM 150 by introducing a sputtering gas, such as argon, through an inlet (not shown) and into a container portion 120 of cathode 110. By applying a negative bias in the order of −200 VDC to −600 VDC on cathode 110 while holding the chamber at ground potential (not shown), an electric field is generated across the sputtering gas. The negative bias on cathode 110 accelerates positive ions towards target 104 to sputter atoms from target 104 and onto substrate 2.

Main magnetic stack 103 generates the main magnetic fields of HCM 150. Magnetic stack 103 comprises a plurality of magnets which are stacked one on top of another. Magnetic stack 103 surrounds HCM 150 about symmetry axis 106. Some field lines of magnetic stack 103, shown as field lines 101, will loop onto target 104. Other magnetic field lines will be directed away from target 104 as shown by field lines 102. As taught by Helmer, field lines 101 confine the majority of ions and electrons within container 120 to maintain a high density plasma. Magnetic field line 108, also known as separatrix, is the boundary between field lines 101 and field lines 102 (hereinafter, the terms "separatrix" and "field line 108" will be used interchangeably). The separatrix serves as the boundary between plasma confined within container 120 and plasma that has escaped.

Figure 2:
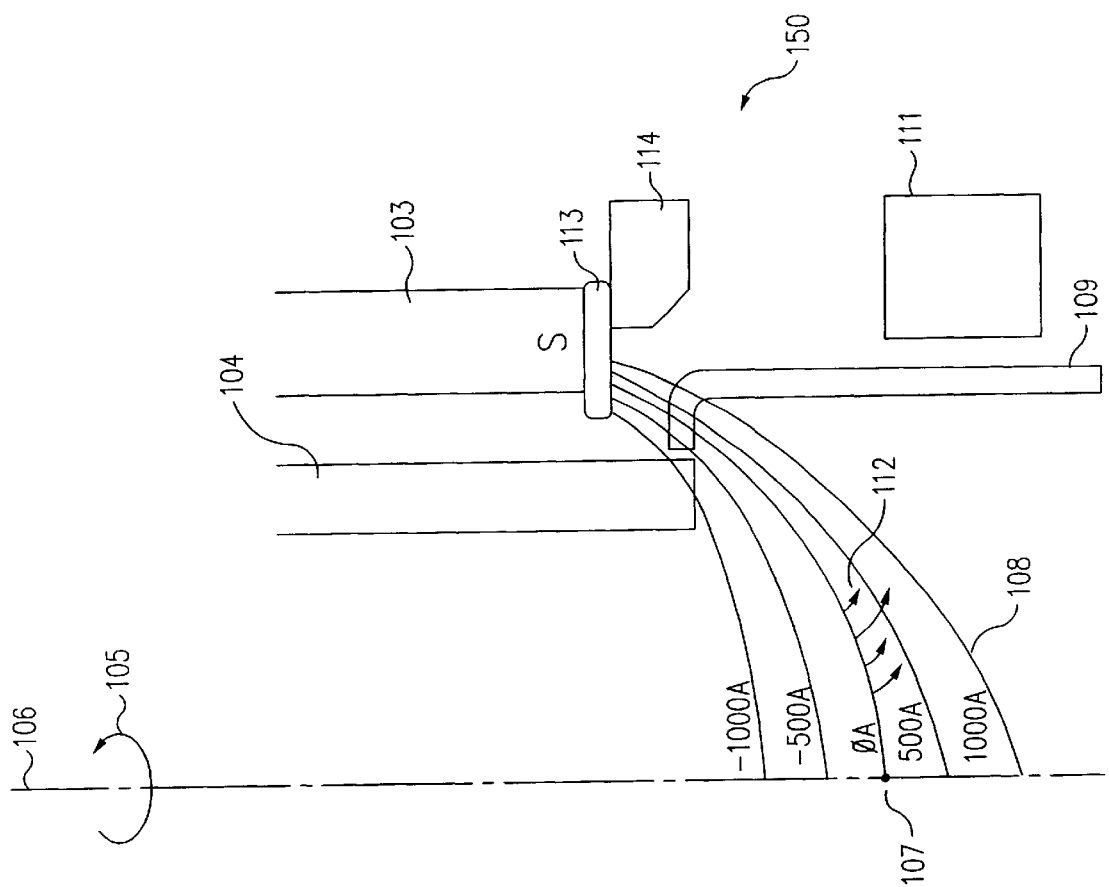
FIG. 2 shows how the separatrix is affected by varying the current through the coil.

Because HCM 150 can sustain a high density plasma, atoms sputtered from target 104 will have a high probability of becoming ionized. Thus, plasma escaping out of container 120 will mostly consist of ions and electrons which are affected by magnetic fields. By varying the shape of the magnetic fields of magnetic stack 103, the plasma escaping from container 120 can thus be directionally controlled. A coil 111 is placed at a distance from the opening of cathode 110 to vary the shape of the separatrix (i.e. field line 108). As shown in FIG. 2, by adjusting the current through coil 111, thereby varying the strength of its magnetic field, the shape of the separatrix and plasma flow indicated by arrows 112 can be controlled. A coil current in the order of ±0 to 5A, which corresponds to ±0 to 2500 Amp-turns, can change the plasma flow from a highly focused beam to a widely spread profile. Thus, by varying the magnetic field strength of coil 111, the profile of the plasma streaming onto the substrate can be controlled to achieve a desired deposition uniformity. It is to be noted that deposition uniformity is extremely sensitive to the current in coil 111. For titanium deposition, for example, a mere variation of 0.05 to 0.1A (10 to 20Amp-turns) in coil current can cause a significant change in uniformity. The practitioner must therefore try different values of coil current in order to get the best uniformity for a given application.

Coil 111 can be used to control the plasma profile because the separatrix serves as a "lens element" in spreading or focusing the plasma escaping from container 120. This lens element effect is similar to ion extraction through an orifice where the electric field near the orifice operates as an aperture for the plasma. For the magnetic configuration shown in FIGS. 1 and 2, the separatrix operates as a diverging lens that spreads out the plasma streaming out of container 120. As shown in FIG. 2, the higher the coil current, the further magnetic null 107 moves away from the opening of cathode 110. A bottom pole piece 113 is used to minimize the movement of the ends of the separatrix with varying coil current. Because the ends of the separatrix remain relatively fixed on bottom pole piece 113 while magnetic null 107 moves, coil 111 is essentially a control "knob" for varying the "focal length" of the separatrix "lens" to control plasma flow from container 120. As FIG. 2 indicates, plasma spreads out more as coil current is increased.

Using the teachings of the present invention, it is thus possible to engineer the shape of the separatrix by using different configurations to optimize the uniformity and profile of the escaping plasma for processes in addition to physical vapor deposition. For ion implantation applications, for example, an ion source may incorporate the teachings of this invention to have a flat or concave separatrix in order to focus the escaping plasma into a tight spot for ion extraction. The concept of the separatrix acting as a single aperture lens in a cusp mirror for ‚plasma extraction should also find uses in other plasma source designs that have a similar magnetic geometry.

As is evident to one of ordinary skill in the art, the present invention can be employed without regard to the number and type of magnets used for shaping the separatrix lens. For example, multiple magnets can be individually controlled and located between the cathode and the substrate to focus the escaping plasma. This is analogous to using multiple lenses in collimating light beams. Further, permanent magnets with predetermined field strengths can also be used in lieu of electromagnets.

The cathode, the reactor, and the plasma therebetween comprise an electrical circuit. The impedance of this electrical circuit is commonly referred to as discharge impedance. Discharge impedance is directly related to the amount of free electrons in the plasma: the more free electrons in the plasma, the lower the discharge impedance. It has been observed that magnetic fields from coil 111 affect the discharge impedance. Depending on the direction of the current in coil 111, the magnetic fields produced by coil 111 will either aid or "buck" field lines 101 produced by magnetic stack 103. In an aiding configuration (i.e. field lines 101 are strengthened), coil 111 increases the discharge impedance. On the other hand, in a bucking configuration, coil 111 decreases the discharge impedance. Care must be taken such that the discharge impedance is not increased to the point where the plasma is no longer sustainable. In an aiding configuration, for example, the residual magnetic fields of magnetic stack 103 can be decreased such that the "mirror effect" is not achieved. This leads to a decrease in plasma confined within container 120, an increase in the spread of plasma escaping out of container 120, and corresponding increase in discharge impedance to a point where plasma is no longer sustainable.

With the above caveat regarding the effect of coil 111 to the discharge impedance, it has been observed that using coil 111 in an aiding configuration promotes good deposition uniformity. However, in applications where ionization efficiency is more important than uniformity, using coil 111 in a bucking configuration maximizes plasma confinement. Maximizing plasma confinement within container 120 results in higher ionization levels of sputtered metal atoms because there are more ions available for ionization. From the foregoing, one of ordinary skill in the art will appreciate that utilizing one bucking magnet near the target and one aiding magnet near the substrate would provide both high ionization efficiency and good process uniformity across the substrate.

As can be seen in FIG. 2, there is still a slight movement of the separatrix from the opening of target 104 and towards anode 109 as the current in coil ill is increased. In general, as magnetic field lines connect a portion of the cathode directly to the anode, electron confinement within the cathode decreases which leads to an increase in discharge impedance. In other words, as the separatrix begins to intercept the anode, the discharge impedance would increase due to premature loss of primary electrons. Thus it is preferable for the separatrix to intersect cathode 110 rather than anode 109. To ensure full face erosion of target 104, a highly desirable result, it is also preferable to have the separatrix intersect cathode 110 as close to its opening as possible.

It is also advantageous to place coil 111 at a distance further away from the opening of cathode 110 to minimize the movement of the ends of the separatrix from pole piece 113 and maximize coil 111's effect of bending the separatrix. The placement of coil 111 relative to the bottom of main magnetic stack 103 has a major effect on deposition uniformity. The farther coil 111 is from main magnetic stack 103 (i.e. the closer coil 111 is to substrate 2), the better the deposition uniformity. This is consistent with the theory that the separatrix acts as a magnetic lens element and the distance between coil 111 and main magnetic stack 103 determines the shape of the separatrix and, thus, the lens' focal length.

Pole piece 113 should be positioned as close to, but radially away from, the plane defined by the opening of cathode 110. This is to minimize movement of the separatrix with varying current in coil 111. In cases where it is not possible to put pole piece 113 close enough to the opening of cathode 110, an anode which include a piece made of soft magnetic materials can be used. This anode, for example, can consist of a magnetic piece and a non-magnetic piece sealed in-between by an o-ring. The magnetic and non-magnetic pieces can also be welded together to eliminate the o-ring and any possible seams in-between. In FIG. 3A, the inlet hardware for a water-cooling jacket 4 prevents a bottom pole piece 205 from being placed as optimally as possible near the opening of a target 3. Thus, an anode 208 is fabricated using a magnetic piece 204B and a non-magnetic piece 204A. It is to be noted that magnetic piece 204B, although manufactured as part of anode 208, is effectively a magnetic pole piece. The portion of anode 208 which actually functions as an anode is the non-magnetic piece 204A. As is known in the art, a magnetic material, such as magnetic piece 204B, provides a path of least resistance for magnetic fields. Thus, field lines from the main magnetic stack will be steered into magnetic piece 204B which is near the opening of target 3.

Figure 3:
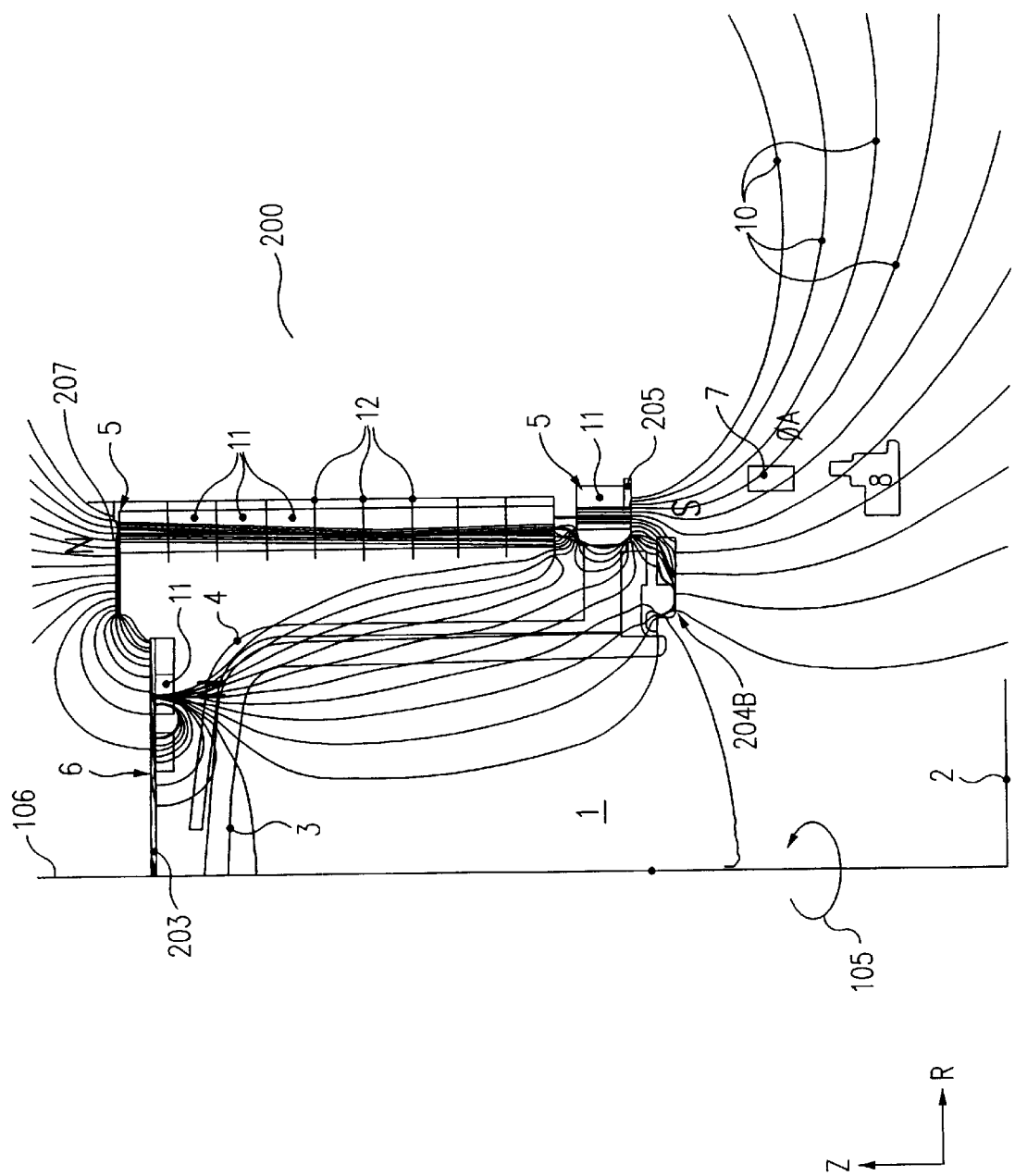
FIGS. 3 and 3A show a magnetically non-shielded hollow cathode magnetron source according to the present invention.
Figure 3A:
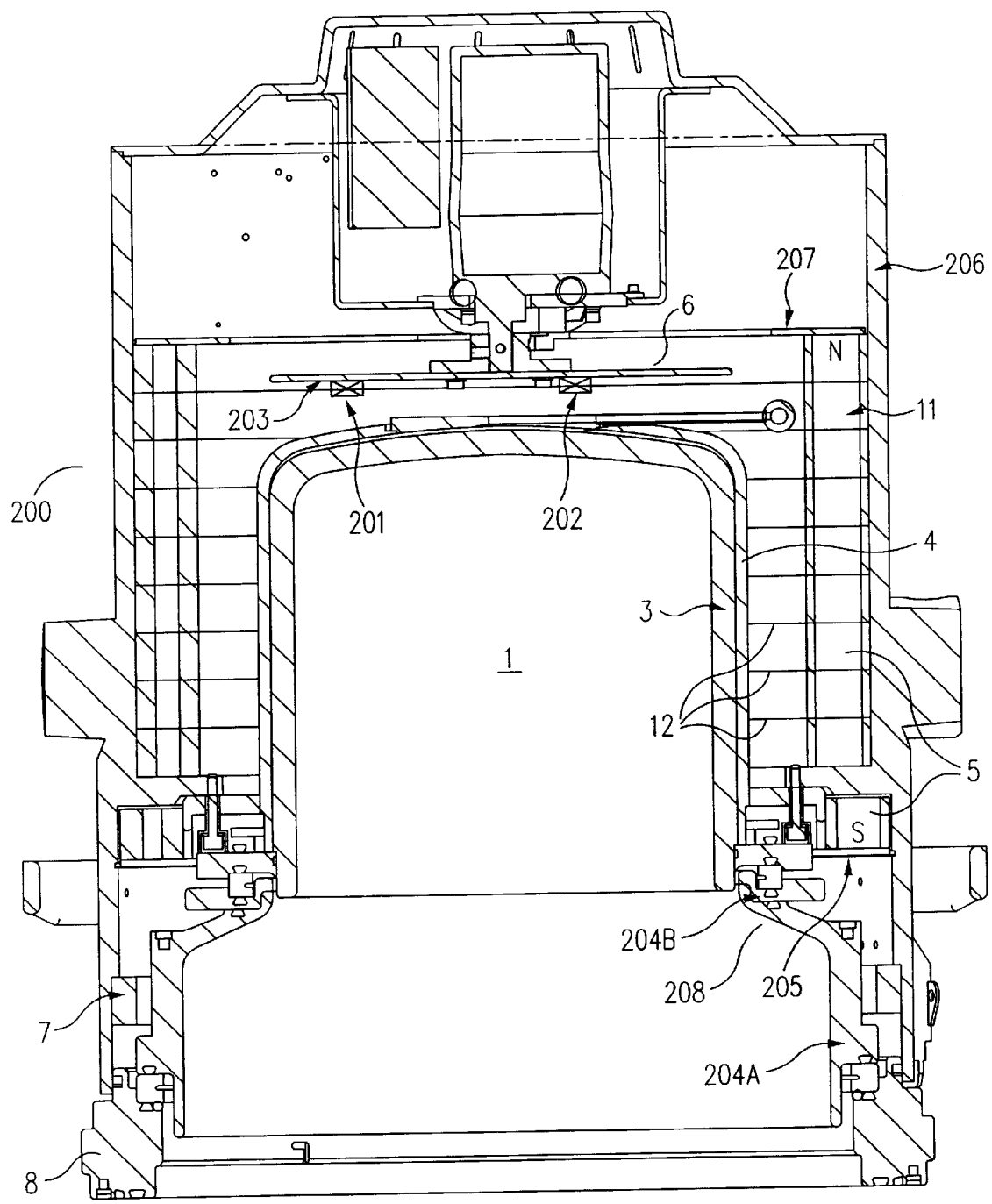

FIGS. 3 and 3A show an HCM 200 according to the present invention. Referring to FIG. 3, HCM 200 includes a side permanent magnet array 5 wherein the bottom is an effective south pole and the top is an effective north pole. Side permanent magnet array 5, which produces the main magnetic flux in this source configuration, consists of magnets 11 stacked in-between iron shims 12. Magnets 11 are oriented to generate magnetic flux in the axial (or Z) direction. Top pole piece 207 and bottom pole piece 205 are placed on the north and south sides of permanent magnet array 5, respectively, to direct and focus magnetic field lines. Also shown is a rotating magnet array 6 as described in commonly-owned U.S. Provisional Application No. 60/114, 888, which is incorporated herein by reference in its entirety. As shown in FIG. 3A, rotating magnet array 6 includes a rotating pole piece 203, a magnet set 201, and a magnet set 202. Rotating magnet array 6 is provided to enhance the erosion profile of target 3. As previously explained, a magnetic coil 7 in a preferred aiding configuration controls the shape of the separatrix to obtain good deposition uniformity on substrate 2 while maintaining a high density plasma within target 3. Magnetic field lines 10 are shown in FIG. 3 for a case where no current is applied through coil 7.

As shown in FIGS. 3 and 3A, HCM 200 also includes water-cooled jacket 4 for cooling the cathode and adapter 8 for connecting anode 208 to the process chamber or reactor. Outer shell 206 encloses source 200 and is made of non-magnetic material in this particular embodiment. Volume 1 represents the container portion of HCM 200.

From the teachings of the present invention, it is clear that there are many ways to achieve an equivalent or similar magnetic configuration for an HCM other than the stack of cylindrical magnets described in Helmer. A drawback of using a stack of cylindrical magnets is that magnetic field lines extend far beyond the HCM. These leaking magnetic field lines can pose problems for other components nearby that are sensitive to varying weak magnetic fields. With axially configured main magnets, such as magnetic stack 103 and magnet array 5, a magnetic housing cannot be readily employed for shielding purposes. This is because the magnetic housing will substantially interfere with axially oriented magnetic fields. One solution to the problem is to use a magnetic housing having a surface which is far enough from the main magnet. Another solution is to use magnets which magnetic fields are oriented substantially normal to the plane of the magnetic housing. Using electromagnets to generate the main magnetic flux also allows for the use of a magnetically shielded housing. In such configuration, the magnetic housing becomes a part of the magnetic circuit and can be taken into account accordingly.

Figure 4:
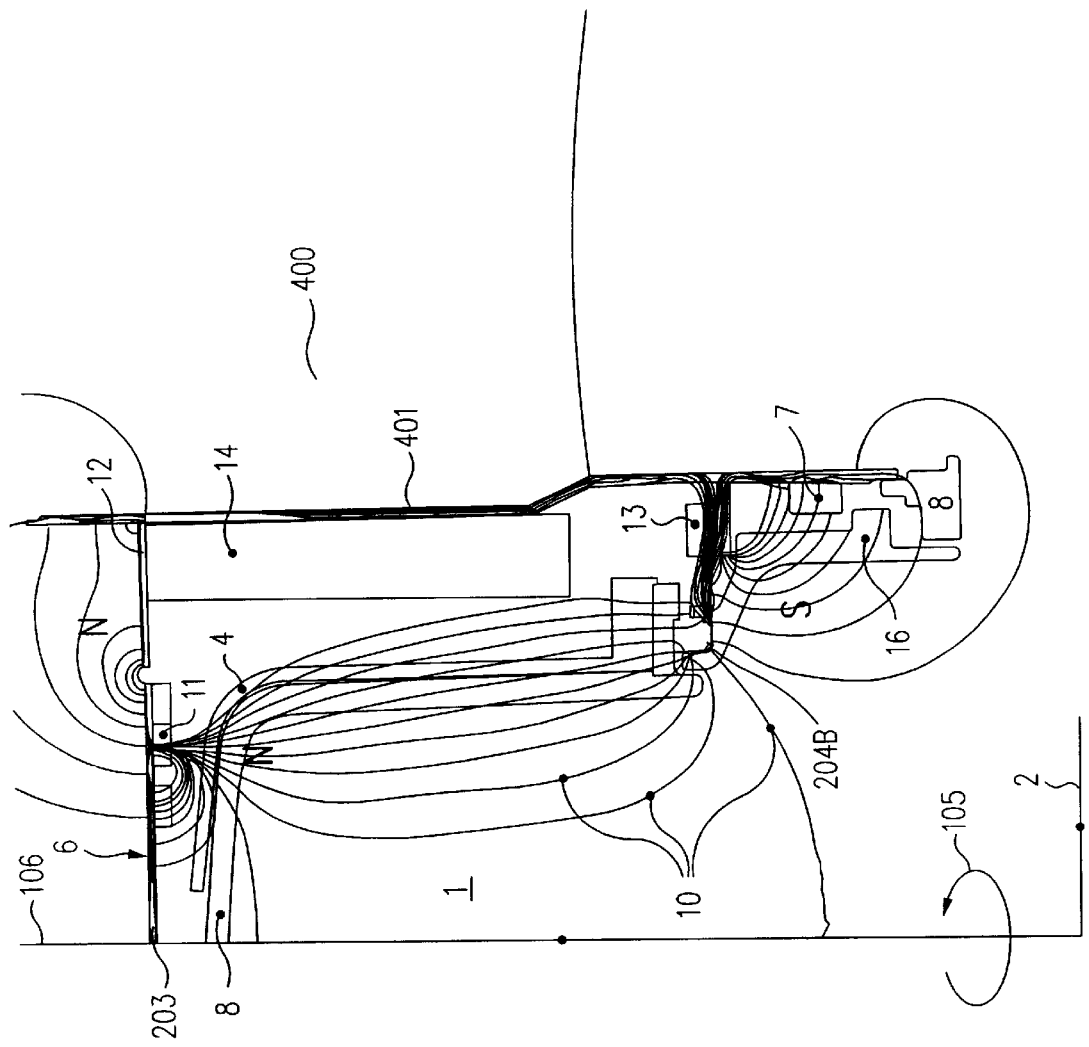
FIG. 4 shows a magnetically shielded hollow cathode magnetron source according to the present invention.

FIG. 4 shows a magnetically shielded HCM 400 according to the present invention. Instead of using axial permanent main magnets, one or more electromagnet coils 14 are used to generate magnetic field lines 10. Power supplies (not shown) are used to supply a fixed or variable current through coils 14. Coils 14 can also be turned on and off during processing. In order to control the position of the separatrix, a radially-charged array of permanent magnets 13 is placed behind magnetic piece 204B near the opening of target 3. Magnets 13 can also be in-contact with magnetic piece 204B. Magnetic piece 204B is positioned on top of a non-magnetic anode piece 16. Anode piece 16 can be electrically floating, grounded, or biased. Outer shell 401, which is made out of a soft magnetic material, is provided around the outer diameter of HCM 400 to prevent magnetic flux leakage. Coil 7 is placed downstream of target 3 to control the shape of the separatrix, thereby controlling the plasma confinement properties of HCM 400 and deposition uniformity on substrate 2.

Figure 5:
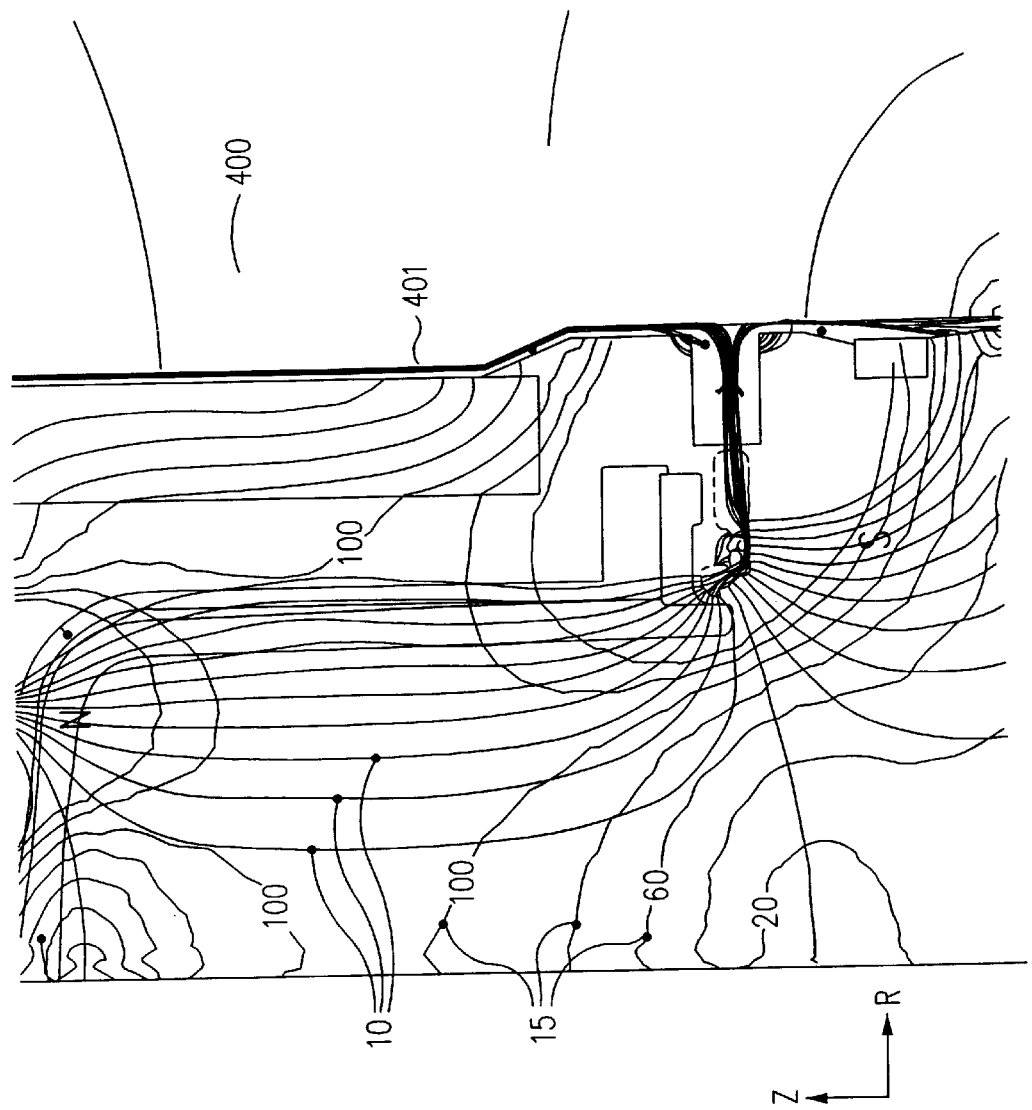
FIG. 5 shows a magnetostatic simulation plot for the magnetron source shown in FIG. 4.

FIG. 5 shows a typical magnetostatic simulation of the shielded HCM 400. In FIG. 5, magnetic field strength values are shown in units of Gauss. Contours 15 indicate the magnitude of the magnetic field, |B|. Contours 15 are from a solution of Maxwell's equations. As can be seen in FIG. 5 and other simulation plots in this disclosure, contours 15 tend to be orthogonal to field lines 10. Because the entire magnetic structure is enclosed within magnetic outer shell 401, which also serves as a return for the magnetic field lines outside the target area, very little magnetic field leaks outside of HCM 400.

Figure 6:
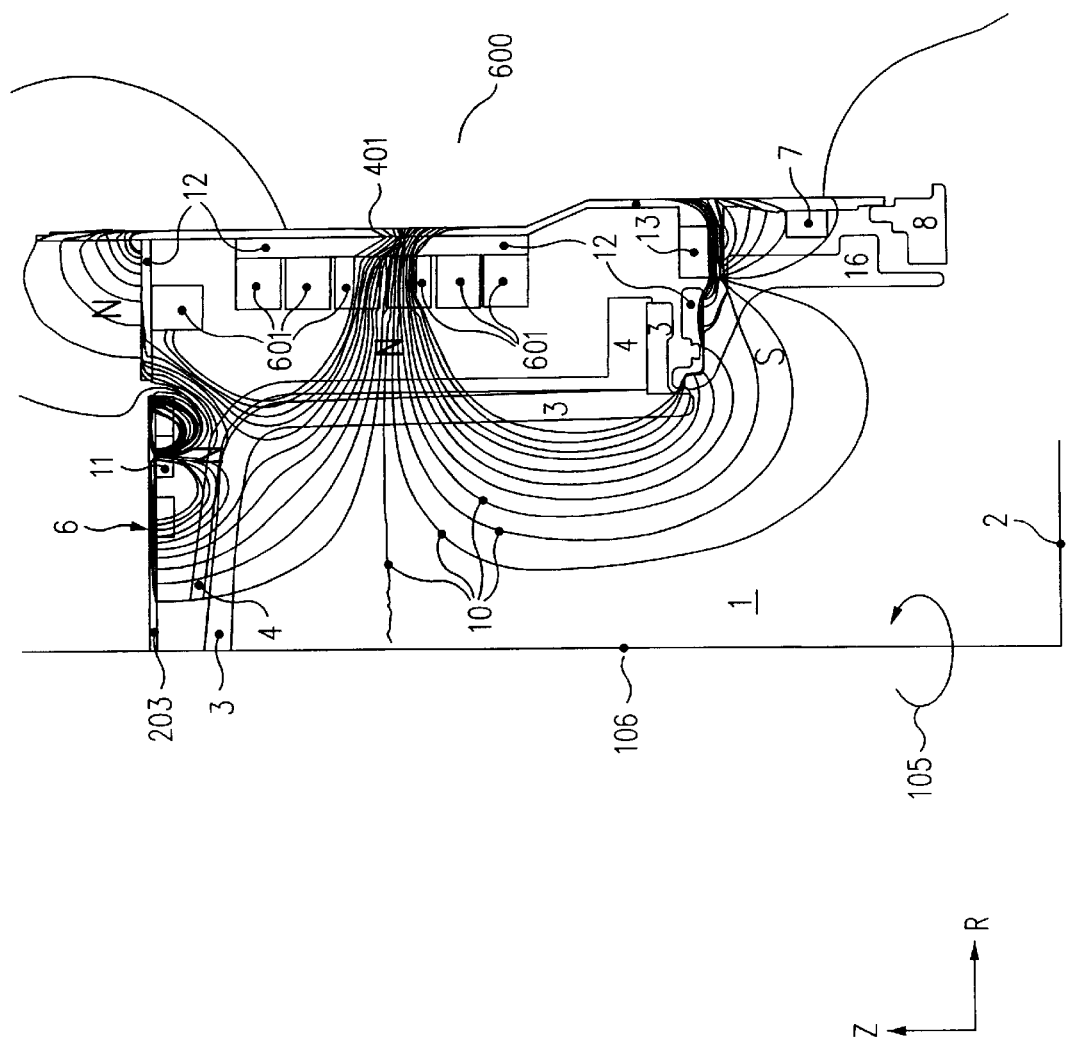
FIG. 6 shows a magnetically shielded hollow cathode magnetron source according to the present invention wherein the main magnet is an array of radially-charged permanent magnets.

FIG. 6 shows another magnetically shielded HCM 600 where an array of radial magnets 601 is used to create the main magnetic fields. Radial magnets 601 are oriented to produce magnetic flux in the radial direction. In FIG. 6, outer shell 401 is made of a magnetic material to prevent magnetic flux leakage. The same configuration can be used in a non-shielded configuration by making outer shell 401 out of a nonmagnetic material.

Figure 7:
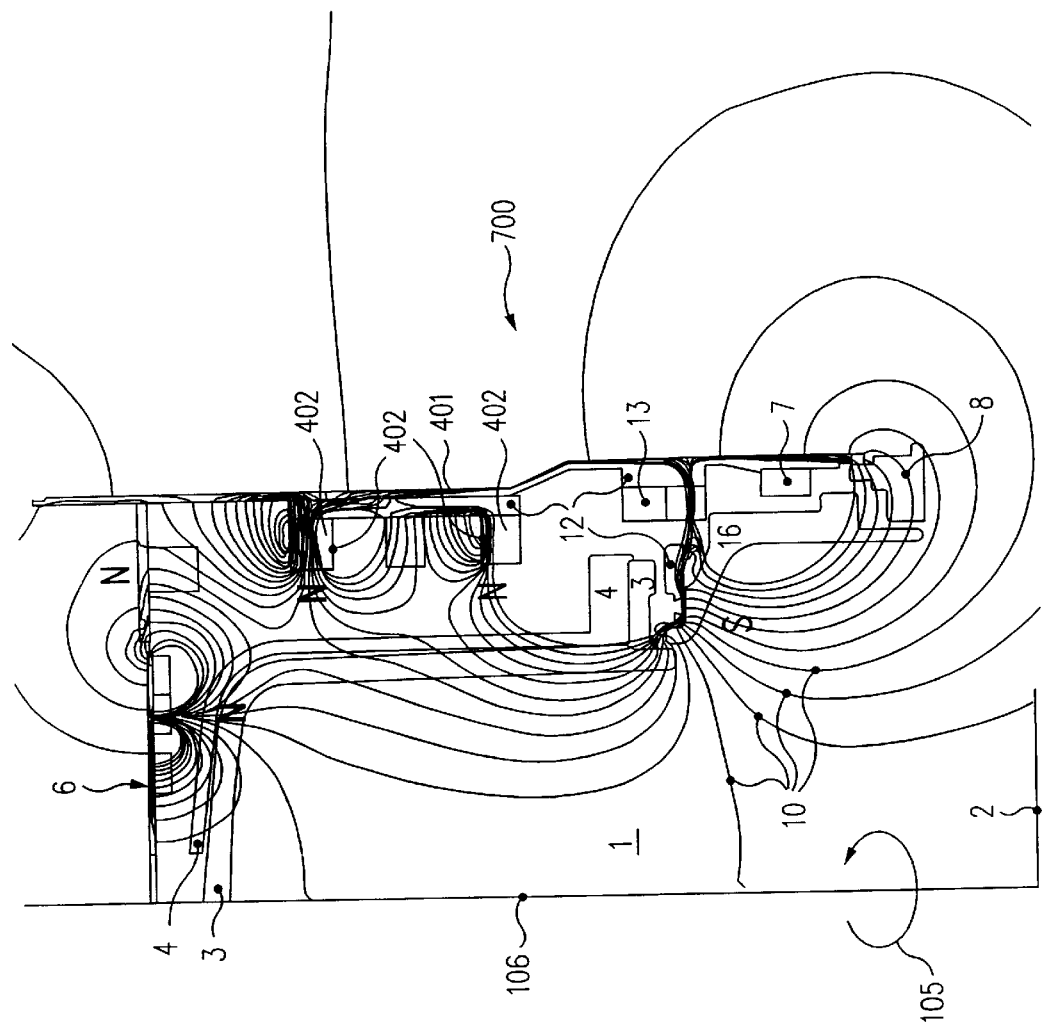
FIG. 7 shows a magnetically shielded hollow cathode magnetron source according to the present invention wherein the main magnet is an array of permanent magnets which are radially located on a pole piece.
Figure 8:
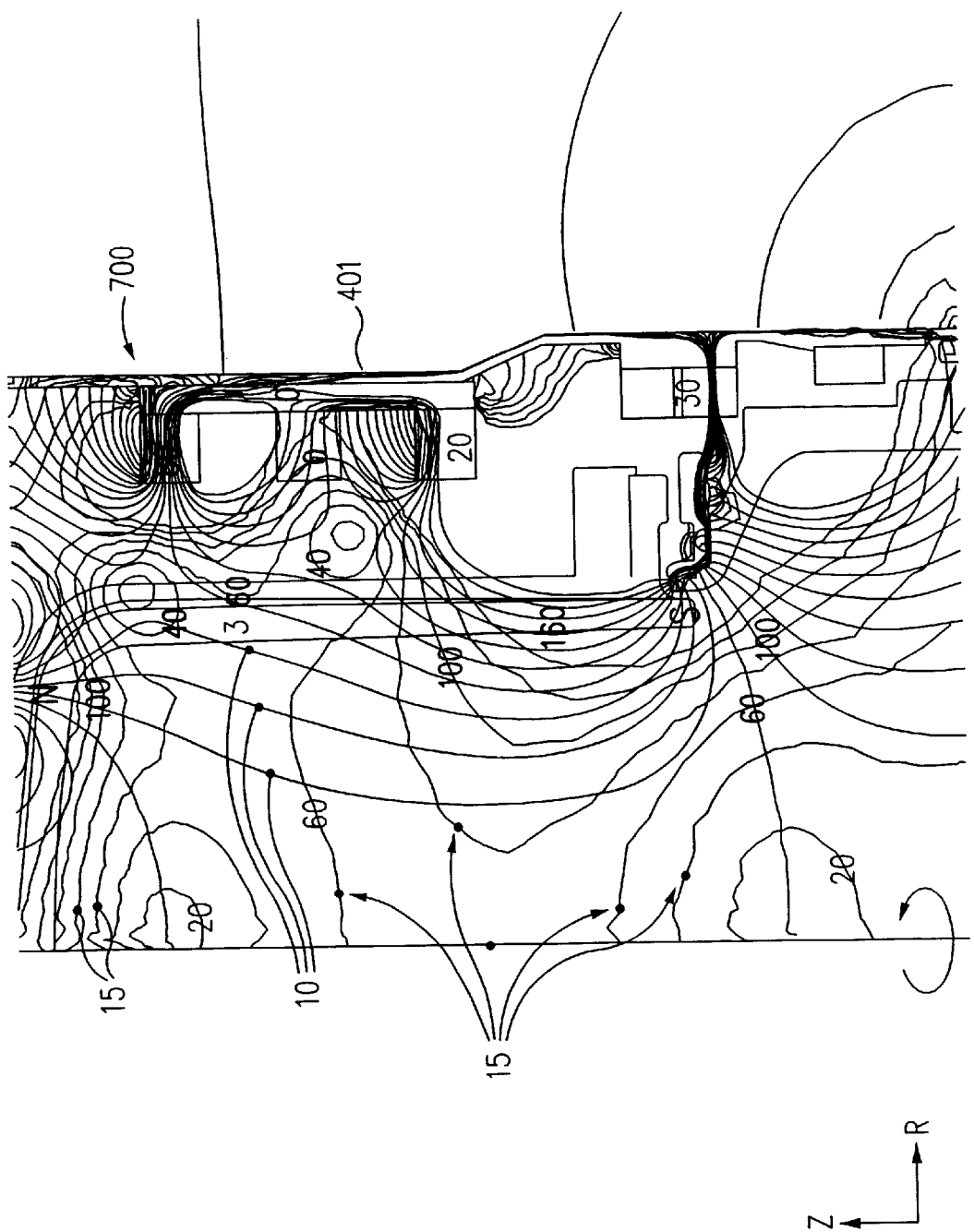
FIG. 8 shows a magnetostatic simulation plot for the magnetron source shown in FIG. 7.
Figure 9:
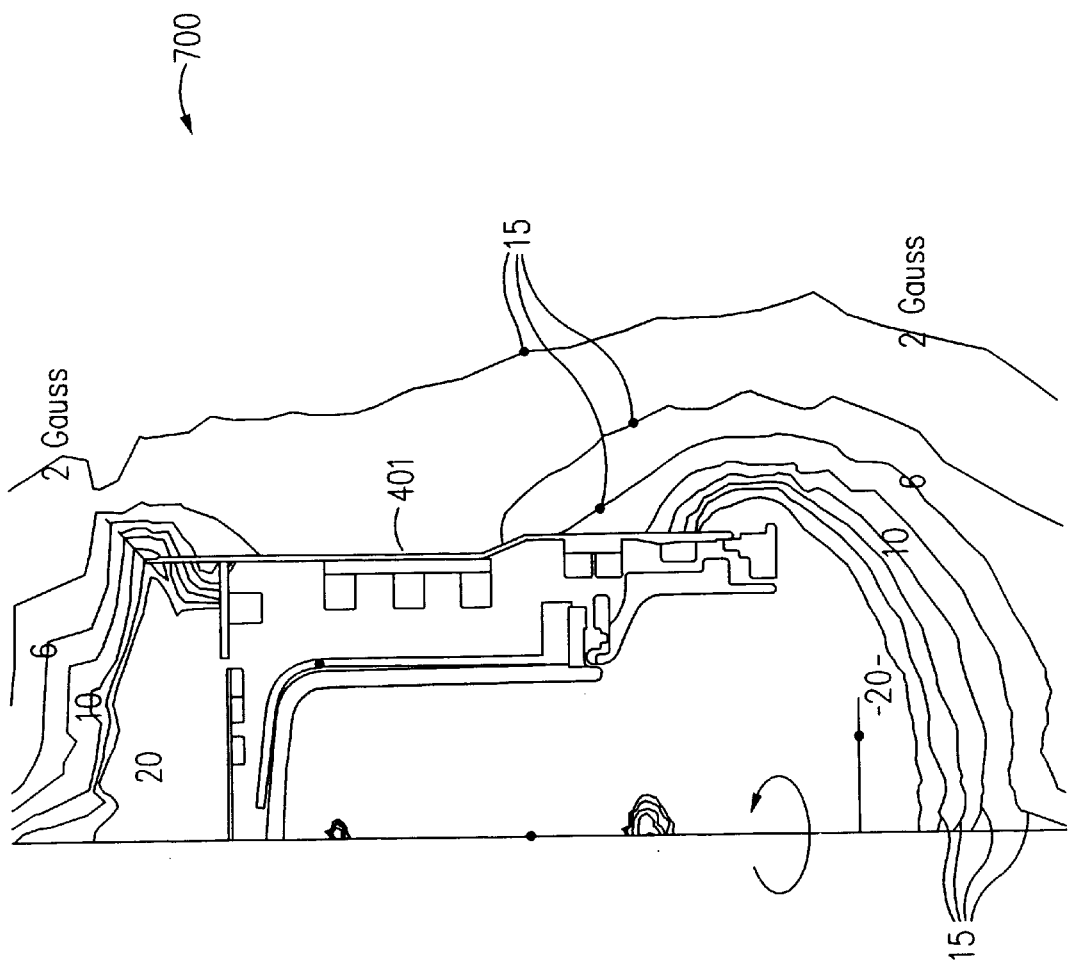
FIG. 9 shows the magnetic leakage outside the magnetron source shown in FIG. 7.

FIG. 7 shows a variation of HCM 600. In magnetically shielded HCM 700, permanent magnets 402 are radially located on a pole piece. FIG. 8 shows a magnetostatic simulation for HCM 700 while FIG. 9 shows the corresponding magnetic flux leakage. As in HCM 400 and HCM 600, very little magnetic fields leak outside HCM 700 because outer shell 401 is made of a magnetic material.

It is to be understood that the description of the invention given above is for purposes of illustration and is not intended to be limiting. Numerous variations are possible without deviating from the scope and spirit of the invention. For example, permanent magnets having pre-determined desired magnetic field strength can be used in place of electromagnets. Further, the number, type, and shape of components or magnetic materials shown can be insubstantially varied to achieve the same effect as that disclosed herein.

What is claimed is:

1. A physical vapor deposition reactor comprising:
   a cup-shaped target having a central axis;
   a substrate positioned such that said axis intersects said substrate;
   an annular first magnet surrounding said target and said axis; and
   an annular second magnet, positioned around said axis and between said target and said substrate, which is used to control the shape of a separatrix generated by the first magnet.

2. The physical vapor deposition reactor of claim 1 wherein the target comprises a material selected from the group consisting of aluminum, tantalum, titanium or copper.

3. The physical vapor deposition reactor of claim 1 wherein the first magnet comprises a magnet stack having poles oriented substantially parallel with said axis.

4. The physical vapor deposition reactor of claim 1 wherein the first magnet comprises has a pole oriented radially with respect to said axis.

5. The physical vapor deposition reactor of claim 1 wherein the second magnet comprises an electromagnet.

6. The physical vapor deposition reactor of claim 1 wherein the first magnet comprises an electromagnet.

7. The physical vapor deposition reactor of claim 1 comprising an annular third magnet positioned around said axis and between said target and said second magnet.

8. The physical vapor deposition reactor of claim 1, wherein the target forms a hollow cathode and the first magnet provides a separatrix, at the opening of the cathode, which is shaped by the second magnet.

9. The physical vapor deposition reactor of claim 1, wherein the second magnet is used to spread or focus the plasma streaming onto the substrate.

10. A magnetron physical vapor deposition reactor comprising:
    a cup-shaped target having a central axis, said target surrounding a first segment of said central axis;
    a substrate positioned such that said substrate intersects a second segment of said axis;
    an annular first magnet surrounding said target and said axis; and
    an annular second magnet positioned around a third segment of said axis, said third segment of said axis being located between said first and second segments of said axis, wherein the second magnet serves to spread or focus plasma streaming onto the substrate.

11. The physical vapor deposition reactor of claim 10 wherein the target comprises a material selected from the group consisting of aluminum, tantalum, titanium or copper.

12. The physical vapor deposition reactor of claim 10 wherein the first magnet comprises a magnet stack having poles oriented substantially parallel with said axis.

13. The physical vapor deposition reactor of claim 10 wherein the first magnet comprises has a pole oriented radially with respect to said axis.

14. The physical vapor deposition reactor of claim 10 wherein the second magnet comprises an electromagnet.

15. The physical vapor deposition reactor of claim 10 wherein the first magnet comprises an electromagnet.

16. The physical vapor deposition reactor of claim 10 comprising an annular third magnet positioned around said axis and between said target and said second magnet.

17. The magnetron physical vapor deposition reactor of claim 10 wherein the second magnet controls the shape of a separatrix generated by the first magnet to shape the profile of ions and electrons onto the substrate.

18. The magnetron physical vapor deposition reactor of claim 10, wherein the first magnet generates a separatrix near the third segment of said axis, the separatrix being shaped by the second magnet to spread or focus plasma streaming onto the substrate.

19. A physical vapor deposition reactor comprising:
    a cup-shaped target having a central axis;
    a substrate positioned such that said axis intersects said substrate;
    an annular first magnet surrounding said target and said axis, wherein the first magnet comprises a magnet stack having poles oriented substantially parallel with said axis; and
    an annular second magnet positioned around said axis and between said target and said substrate.

20. The physical vapor deposition reactor of claim 19, wherein the magnet stack further comprises a bottom pole piece.

21. The physical vapor deposition reactor of claim 19, wherein the target comprises a material selected from at least one of aluminum, tantalum, titanium, and copper.

22. The physical vapor deposition reactor of claim 19, wherein the second magnet controls the shape of magnetic fields generated by the first magnet.

23. The physical vapor deposition reactor of claim 22, wherein the second magnet controls the shape of a separatrix generated by the first magnet to control the profile of plasma streaming onto the substrate.

* * * * *